(12) United States Patent
Kitade (10) Patent No.: US 6,687,135 B1
(45) Date of Patent: Feb. 3, 2004

(54) ELECTRONIC COMPONENT WITH SHIELD CASE

(75) Inventor: Kazuhiko Kitade, Kaga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/716,085

(22) Filed: Nov. 17, 2000

(30) Foreign Application Priority Data

Nov. 19, 1999 (JP) .......................................... 11-329455

(51) Int. Cl.[7] ................................................ H05K 9/00
(52) U.S. Cl. ........................ 361/816; 361/818; 361/800; 361/801; 174/52.1; 174/50; 174/51
(58) Field of Search ................................. 361/816, 818, 361/820, 821, 758, 759, 807, 808, 809, 810, 800, 801; 174/35 R, 50, 51, 52.1

(56) References Cited

U.S. PATENT DOCUMENTS

| | | | |
|---|---|---|---|
| 5,353,201 A | * 10/1994 | Maeda | 361/816 |
| 5,461,546 A | 10/1995 | Kobayashi et al. | |
| 5,508,889 A | * 4/1996 | Ii | 361/816 |
| 5,896,275 A | * 4/1999 | Gaeta et al. | 361/760 |
| 6,079,099 A | * 6/2000 | Uchida et al. | 29/837 |
| 6,125,044 A | * 9/2000 | Cherniski et al. | 361/799 |
| 6,181,573 B1 | * 1/2001 | Riet | 361/816 |
| 6,195,244 B1 | * 2/2001 | Barz | 361/111 |
| 6,205,027 B1 | * 3/2001 | Nakajima | 361/719 |
| 6,239,359 B1 | * 5/2001 | Lilienthal, II et al. | 174/35 |

FOREIGN PATENT DOCUMENTS

| | | |
|---|---|---|
| JP | 62-98298 | 6/1987 |
| JP | 6-50399 | 7/1994 |
| JP | 9-307261 | 11/1997 |
| JP | 10-41665 | 2/1998 |
| JP | 10-256412 | 9/1998 |
| JP | 11-145669 | 5/1999 |

OTHER PUBLICATIONS

Japanese Examination Report dated Jul. 2, 2002, along with the English translation.

* cited by examiner

Primary Examiner—David Martin
Assistant Examiner—Thanh S. Phan
(74) Attorney, Agent, or Firm—Keating & Bennett, LLP (57) ABSTRACT

The present invention provides an electronic component with high positional accuracy for attaching a shield case to a substrate while being excellent in shielding performance and having high reliability for mounting, wherein engaging recesses are provided on the side face of the substrate mounting the surface mounted component, and a plurality of engaging pins to be inserted into the engaging recesses of the substrate are provided on the shield case, the engaging pin of the shield case being so configured as to engage with the engaging recess while applying an enhanced elastic force to the engaging pin, thereby allowing the shield case to be securely held on the substrate by the plural engaging pin inserted into the engaging recesses of the substrate.

7 Claims, 6 Drawing Sheets

ELECTRONIC COMPONENT WITH SHIELD CASE

BACKGROUND OF THE INVENTION

1. Field of the Invention

The present invention relates to an electronic component. In more detail, the present invention relates to an electronic component with a shield case for housing surface mounted components mounted on a substrate.

2. Description of the Related Art

Electronic components comprises an electronic component 60 with a shield case 65 for housing surface mounted components 64 as shown in FIG. 8.

The electronic component with such shield case has been manufactured by the manufacturing method as described below:

(1) Through-holes 62 are formed on a sheet substrate (a mother substrate) 61 provided with a plurality of substrates 51 for mounting the components, and an electrode 63 for attaching the shield case is formed on an inner circumference face (side face) of each through hole 62 as shown in FIG. 9.

(2) In the next step, the surface mounted component 64 is mounted on a sheet substrate (the mother substrate) 61, and the surface mounted component 64 is soldered to land electrodes (not shown) of the sheet substrate 61.

(3) Subsequently, a solder paste 67 is filled in the through holes 62.

(4) Then, engaging pins 66 of a plurality of the shield cases 65 are inserted into the through holes 62 filled with the solder paste 67.

(5) Then, a plurality of the shield cases 65 are soldered to the sheet substrate 61 by melting the solder in the solder paste 67. The shield cases 65 are connected and fixed to the sheet substrate 61 as shown in FIG. 8 by soldering the engaging pins 66 to the fixing electrodes (shield case attachment electrodes: FIG. 9) 63 in the through holes 62.

(6) Finally, an individual electronic component 60 as shown in FIG. 8 is obtained by cutting the sheet substrate 61 along the lines (cutting lines) A—A using a dicing machine.

The through hole 62 formed on the sheet substrate (mother substrate) 61 has a larger diameter than the width of the engaging pin 66 so that the engaging pin 66 can be easily inserted. Consequently, the shield case 65 is engaged with the through hole with a little gap (play) when the shield case 65 is attached to the sheet substrate 61 by inserting the engaging pin 66 into the through hole 62 in the step for preparing the sheet substrate 61, thereby causing an improper alignment in the subsequent manufacturing step to adversely affect the configurational and dimensional accuracy, and shield characteristics.

Otherwise, the solder that serves for fixing the engaging pin 66 to a fixing electrode 63 of the through hole 62 re-melts in the reflow soldering step for mounting on the printed circuit board, and in the step for manufacturing the individual electronic component 60 (FIG. 8) obtained by cutting the sheet substrate 61 after soldering a plurality of the shield cases 65 on the sheet substrate 61, arising a problem of positional shift of the shield cases 65 or falling of the shield cases 65 out of the substrate to make the component to go out of use.

SUMMARY OF THE INVENTION

Accordingly, the object of the present invention for solving-the problems as hitherto described is to provide an electronic component having high positional accuracy in attaching the shield case to the substrate and high shield performance as well as high mounting reliability.

The present invention for attaining the foregoing objects provides an electronic component with a shield case for housing surface mounted components on a substrate comprising: a substrate provided with engaging recesses for attaching a shield case at plural sites on the side face of the substrate; a surface mounted component mounted on the substrate; and a shield case having a main body covering the surface for mounting the surface mounted component of the substrate, and a plurality of engaging pins to be inserted into the engaging recesses of the substrate, the shield case being so configured as to be bent when predetermined engaging pins are engage with the substrate by inserting the engaging pins into the corresponding engaging recesses of the substrate, wherein the plural engaging pins on the shield case hold the substrate with enhanced elastic force.

The substrate can be securely held with a plurality of the engaging pins inserted into the engaging recess of the substrate by providing the engaging recess on the side face of the substrate and a plurality of the engaging pins on the shield case, the shield case being so configured as to be bent when given engaging pins engage with the substrate by inserting the engaging pins into designated engaging recesses of the substrate, wherein the plural engaging pins on the shield case hold the substrate with enhanced elastic force. Consequently, the shield case has a high positional accuracy for attaching to the substrate and an excellent shielding performance, thereby enabling an electronic component with a shield case with high reliability for mounting.

According to the present invention the configuration of the shield case that allows the shield case to be bent when the engaging pin is inserted into the engaging recess of the substrate as used in the electronic component having the shield case. The configuration of the shield case includes a wide range of concepts such as a configuration for allowing the engaging pin of the shield case to be deflected, a configuration for allowing the main body of the case to be deflected, or a configuration for allowing both of the engaging pin and the main body of the case to be deflected.

In the electronic component with the shield case according to the present invention, the main body of the case and the engaging pins can be made of the unitary member. Otherwise, separate main body of the case and engaging pins can be combined and integrated.

Preferably, a projection or a bending portion is provided on the engaging pin to be engaged with the engaging recess of the substrate.

Providing a projection or a bending portion on the engaging pin of the shield case allows the shield case to be securely connected to the substrate. Consequently, fixing strength of the shield case to the engaging recess of the substrate is improved, thereby positional accuracy of an electronic component for attaching the shield case to the substrate is improved. Further, shielding performance and reliability for mounting is improved.

Preferably, the engaging pins are protruded from the lower surface of the substrate, the shield case being fixed to the substrate by bending the protruding portions of the engaging pins from the lower surface of the substrate.

When the engaging pin is protruded from the lower face side of the substrate, and when the pin protruding from the lower face side of the substrate is bent, the shield case can be securely fixed to the substrate in the manufacturing step, enabling occurrence of positional shift of the shield case to be securely prevented.

In the electronic component with the shield case according to the present invention, preferably, a step portion is provided on the inner circumference of the engaging recess of the substrate, the step portion is engaged with the engaging pin of the shield case.

Forming a step portion for engaging with the engaging pin of the shield case allows reliability for engaging the engaging pin with the engaging recess to be improved. Accordingly reliability of positional accuracy for attaching the shield case to the substrate and shielding performance is further improved.

Preferably, a land electrode for electrical connection to the shield case is provided at the periphery of the engaging recess for mounting the surface mounted component on the substrate, the land electrode being connected to a part of the shield case with a solder.

Providing a land electrode for electrical connection to the shield case at the periphery of the engaging recess to connect a part of the shield case to the land electrode with a solder allows reliability of electrical connection to be improved.

Preferably, a solder plating or a tin plating for improving solderability is applied on the portion of the shield case to be soldered to the land electrode.

Using a shield case subjected to solder plating or tin plating on the portion of the shield case to be soldered to the land electrode allows solderability of the shield case to be improved, thereby further improving reliability for electrical connection.

BRIEF DESCRIPTION OF THE DRAWINGS

FIG. 8 shows a perspective view of the conventional electronic component.

FIG. 9 shows a method for manufacturing the conventional electronic component.

DESCRIPTION OF THE PREFERRED EMBODIMENT

The featured of the present invention will be described in more detail hereinafter with reference to the embodiments.
(Embodiment 1)

Figure 1:
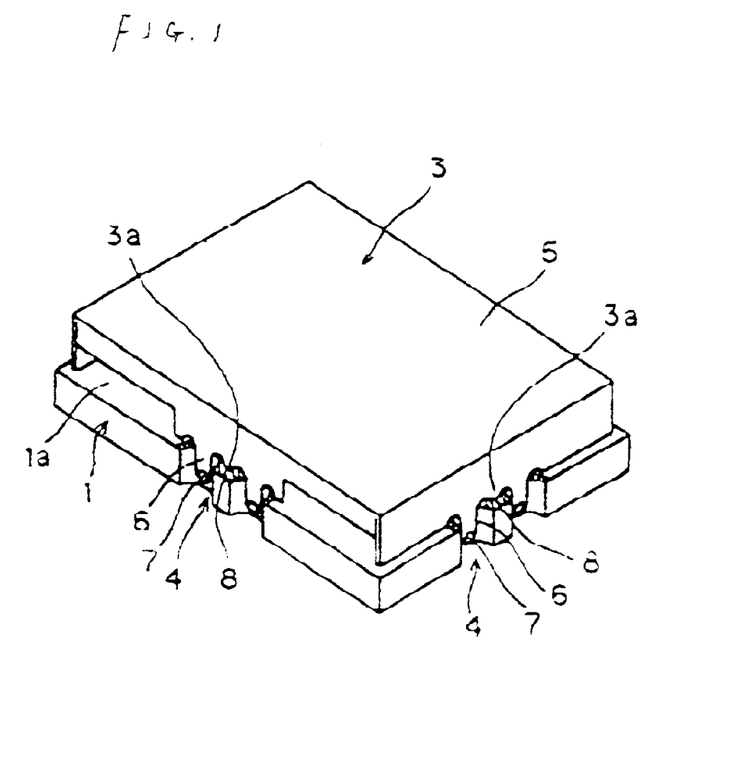
FIG. 1 shows a perspective view of the electronic component with the shield case according to one embodiment of the present invention.
Figure 2:
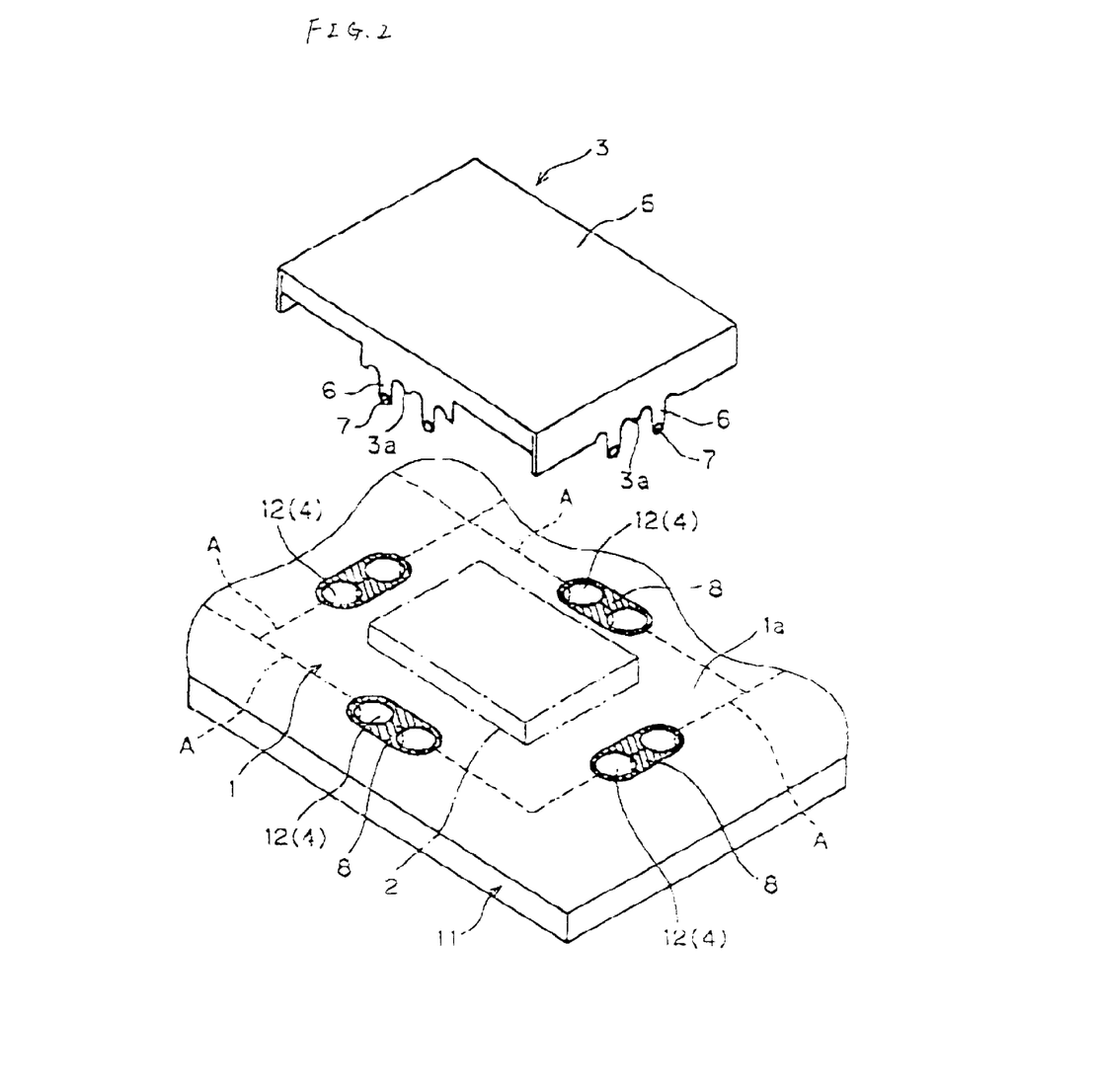
FIG. 2 shows a perspective view of the method for manufacturing the electronic component with the shield case according to one embodiment of the present invention.

FIG. 1 shows a perspective view of an electronic component with a shield case (for example, a high-frequency electronic component such as VCO to be used for a communication equipment) according to one embodiment of the present invention. FIG. 2 shows a perspective view of the electronic component with the shield case in the method for manufacturing same.

As shown in FIGS. 1 and 2, the electronic component with the shield case according to this embodiment has a structure in which the surface mounted component 2 (FIG.2) mounted on the substrate 1 is accommodated in the shield case 3.

Engaging recesses for attaching the shield case (referred as engaging recesses hereinafter) 4 are provided at plural sites of the side face of the substrate 1 constituting the electronic component with the shield case, wherein the recess comprises partially perforated holes formed by cutting a sheet substrate (mother substrate) 11 on which perforation holes are formed (through holes 12, electrodes are disposed on the inner circumference face of the through holes 12 as shown in FIG. 2), and axis of the through hole is extending in the thickness direction of the substrate 1.

A land electrode 8 for electrically connecting to the portion 3a of the shield case 3 opposed to the land electrode is provided at the periphery of the engaging recess 4 on the surface 1a of the substrate 1 for mounting the surface mounted component.

The shield case 3 comprises a main body 5 of the case for housing the surface mounted component 2, and a plurality of engaging pins 6 to be inserted into the engaging recesses 4 of the substrate 1. The main body 5 and the engaging pins 6 of the shield case 3 are bent when the engaging pins 6 are engaged with the engaging recesses 4 of the substrate 1, so that each engaging pin is engaged with each engaging recess with an enhanced elasticity. In other words, the shield case 3 has a shape and size so that the distance between the engaging pins 6 and 6 formed at the opposed side faces of the main body 5 of the case and facing one another is smaller than the distance between the engaging recesses 4 and 4 formed at the opposed side faces of the substrate 1 and facing one another. Consequently, each engaging pin 6 is made to engage with the engaging recesses 4 by being slightly inclined outward.

Figure 3:
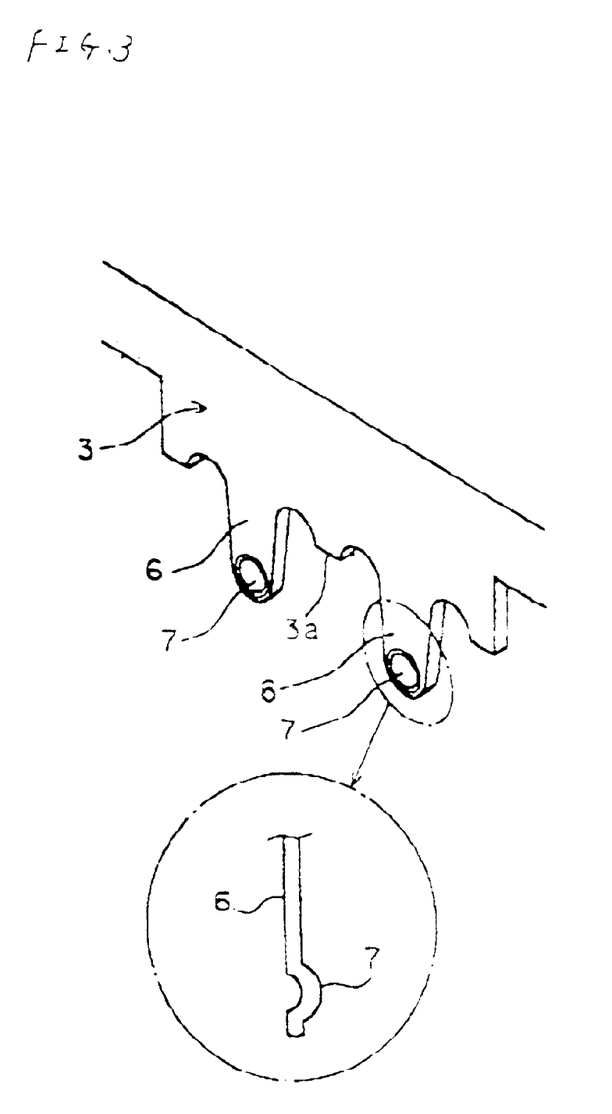
FIG. 3 shows a main part of the shield case used in the electronic component with the shield case according to one embodiment of the present invention.

A projection 7 projecting as a bump (a half-sphere) is formed on the face of the engaging pin 6 of the shield case 3 opposed to the engaging recess 4 (see FIG. 3), so that the engaging pin 6 is more securely engaged with the engaging recess 4 of the substrate 1.

Accordingly, the shield case 3 can be securely fixed to the substrate 1 without causing any positional shift, since the plural engaging pins 6 of the shield case 3 inserted into the engaging recess 4 of the substrate 1 hold the substrate 1 with an enhanced elastic force in the electronic component with the shield case according to this embodiment.

A solder plating or tin plating is applied on the portion (opposed portion) 3a of the shield case 3 which is opposed to the land electrode 8 disposed at the periphery of the engaging recess 4 of the substrate 1.

Since plural engaging pins 6 of the shield case 3 inserted into the engaging recesses 4 of the substrate 1 hold the substrate 1 with an enhanced elastic force in the electronic component with the shield case according to this embodiment so constructed as described above, the shield case 3 is securely fixed to the substrate 1. Consequently, the shield case 3 is attached to the substrate 1 with high positional accuracy besides the shield case has an excellent shielding performance. In addition, a high reliability can be maintained by suppressing positional shift for mounting the shield case 3.

In the electronic component with the shield case according to this embodiment, the land electrode 8 of the substrate 1 is electrically connected to the opposed portion 3a of the case 3. Thus reliability of electrical connection as well as mechanical strength are improved.

Figure 4:
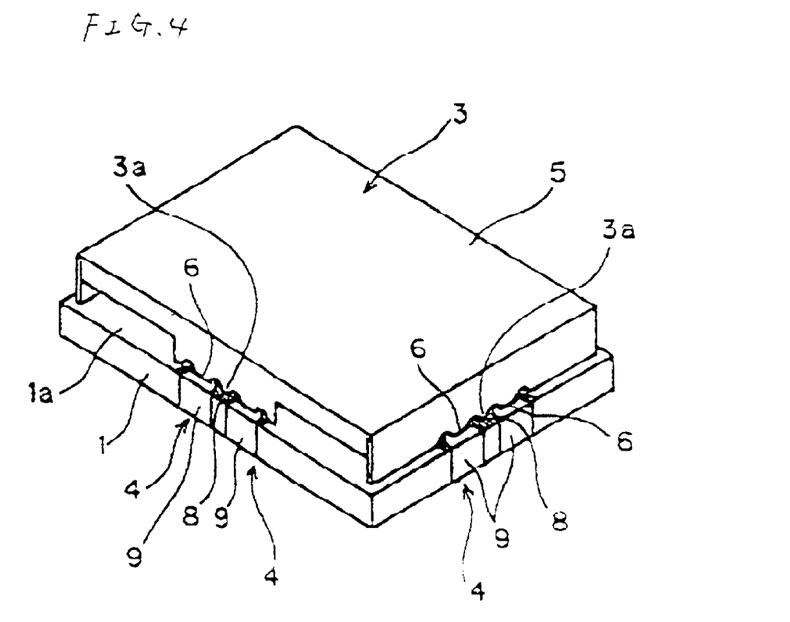
FIG. 4 shows a modification of the electronic component with the shield case according to one embodiment of the present invention.

As shown in FIG. 4 the engaging pin 6 of the shield case 3 is connected and fixed to the electrode disposed on the engaging recess 4 of the substrate 1 with a solder 9. Since the engaging pin 6 of the shield case 3 is securely connected and fixed to the engaging recess 4 of the substrate 1 with a solder 9, reliability of connection of the shield case 3 is more enhanced.

The method for manufacturing the electronic component with the shield case according to this embodiment will be described below.

(1) A sheet substrate (mother substrate) 11, in which the through holes 12 are formed at predetermined positions and land electrodes 8 are formed at the periphery of the through holes 12 on the surface 1a for mounting the surface mounted component, is prepared.

(2) Then, the surface mounted component 2 is mounted on the sheet substrate 11, and the electrode of the surface mounted component 2 is soldered to the electrode and circuitry (not shown) on the sheet substrate 11.

(3) Subsequently, the main body 5 of the shield case 3 and the engaging pins 6 are bent so that the distance between the mutually opposed engaging pins 6 of the shield case 3 is increased, followed by inserting the engaging pins 6 into the through holes 12 (engaging recesses 4) to engage with the through holes 12 (engaging recesses 4) while applying an enhanced elastic force to the engaging pins 6.

(4) Then, individual electronic component with the shield case as shown in FIG. 1 is obtained by cutting the sheet substrate 11 along the line (cutting line) A with a dicing machine.

When the electronic component with the shield case, in which the engaging pin 6 of the shield case 3 is connected and fixed to the engaging recess 4 of the substrate 1 with a solder 9 as shown in FIG. 4, is manufactured, the solder paste is injected into the through hole 12, for example, before inserting the engaging pin 6 of the shield case 3 into the through hole 12 (engaging recess 4) of the sheet substrate 11 in the step (3), followed by soldering the shield case 3 to the sheet substrate 11 by allowing the solder paste to melt by heating after inserting the engaging pin 6 of the shield case 3 into the through hole 12. The electronic component with the shield case as shown in FIG. 4 is thereby obtained by cutting the sheet substrate 11 with a dicing machine.

While a projection 7 projecting as a bump (a half-sphere) is formed on the engaging pin 6 in the foregoing embodiment, the shape of this projection is not particularly restricted, but various configurations can be applied.

Figure 5:
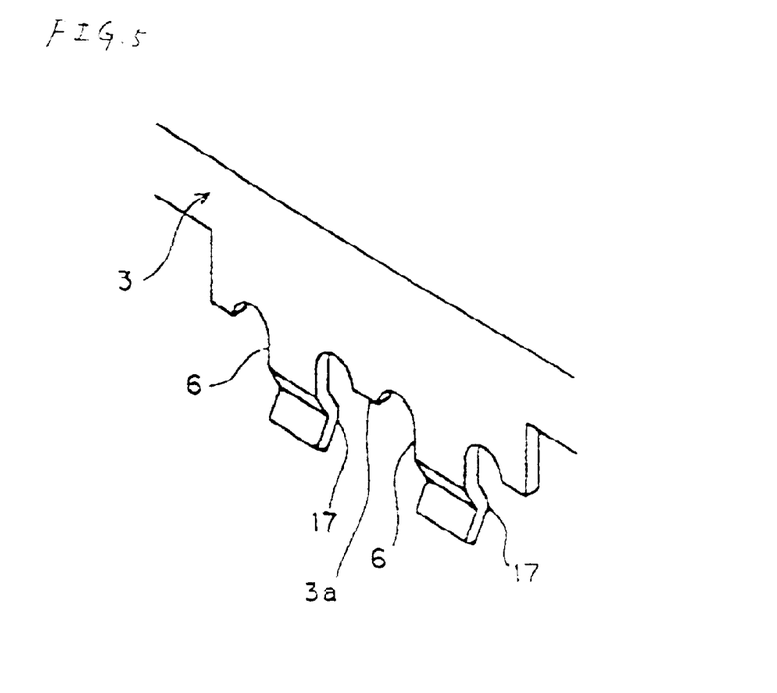
FIG. 5 shows a modification of the shield case used in the electronic component with the shield case according to one embodiment of the present invention.

It is also possible to obtain the same effect as described above by providing a partially protruding bending portion 17 by bending the engaging pin 6 as shown in FIG. 5, instead of providing a projection. The shape of the bent portion is not particularly restricted, but various configurations that allows the substrate to be securely held by engaging with the engaging recess of the substrate may be acceptable.

It is also possible that no projections 7 and bending portions 17 are provided, whereby an expected positional accuracy for attaching the shield case may be obtained since the engaging pin 6 can engage with the engaging recess 4 with an enhanced bend (elastic) force.

(Embodiment 2)

Figure 6:
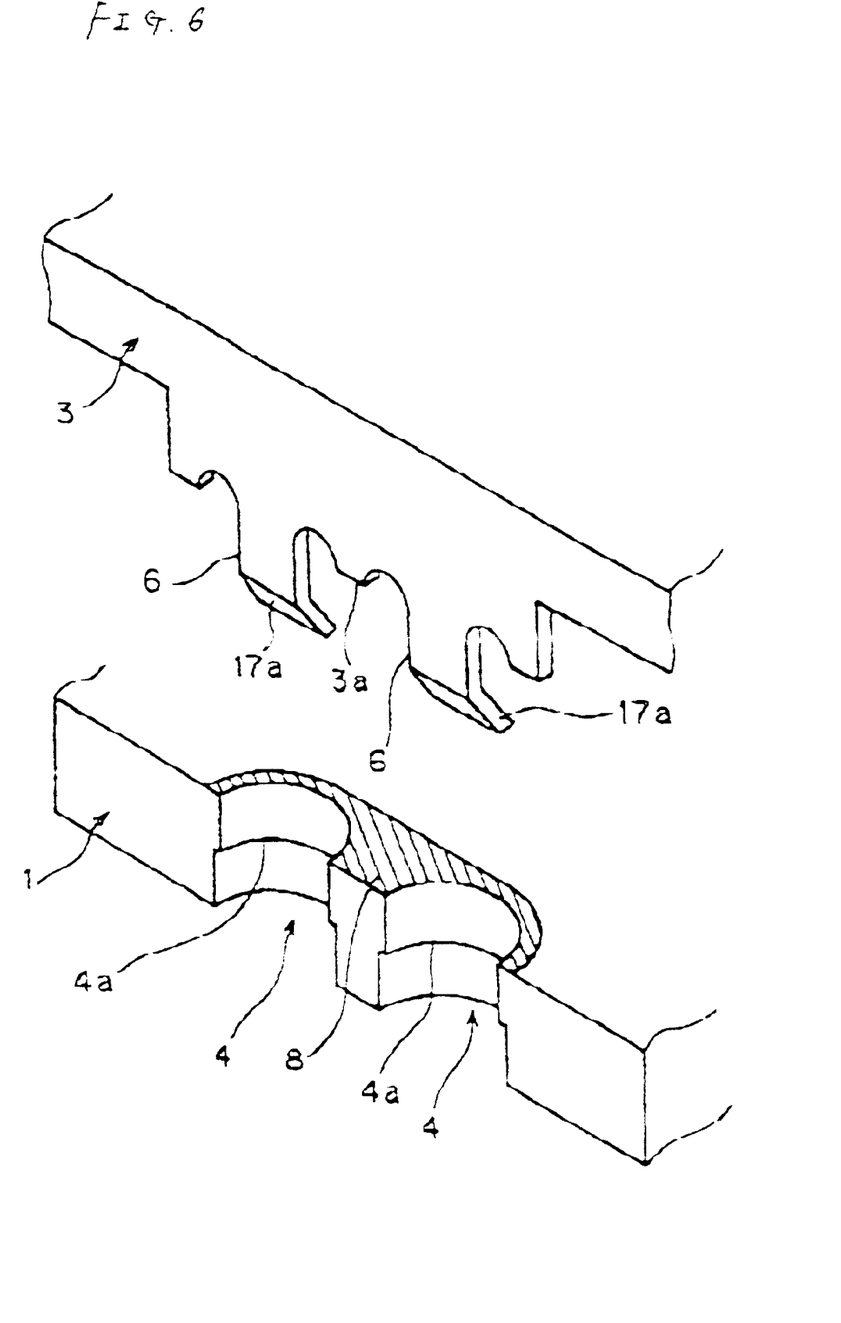
FIG. 6 shows a main part of the electronic component with the shield case according to an another embodiment of the present invention.

FIG. 6 shows a perspective view of an electronic component with a shield case according to an another embodiment (Embodiment 2) of the present invention.

As shown in FIG. 6, a step portion 4a for engaging with the engaging pin 6 of the shield case 3 is disposed on the inner circumference face of the engaging recess 4 of the substrate 1, and a bent portion 17a for engaging with the step portion 4a on the engaging recess 4 is formed at the tip of the engaging pin 6 of the shield case 3 in the electronic component with the shield case according to Embodiment 2.

Since the step portion 4a for engaging with the engaging pin 6 of the shield case 3 is formed on the inner circumference face of the engaging recess 4 of the substrate 1, and the bent portion 17a for engaging with the step portion 4a on the engaging recess 4 is formed at the tip of the engaging pin 6 of the shield case 3 in the electronic component with the shield case according to Embodiment 2, reliability for engaging the engaging pin 6 with the engaging recess 4 can be improved besides allowing positional accuracy for attaching the shield case, shielding performance and reliability of packaging to be improved.

It is also possible in the electronic component with the shield case according to Embodiment 2 that the engaging pin 6 is fixed to the substrate 1 with a solder.

(Embodiment 3)

Figure 7:
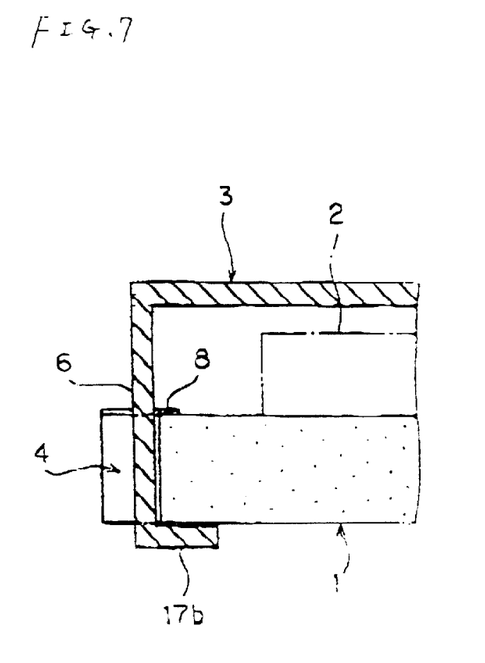
FIG. 7 shows a main part of the electronic components with the shield case according to a different embodiment of the present invention.

FIG. 7 shows a cross section of the main part of the electronic component with the shield case according to a different embodiment (Embodiment 3) of the present invention.

As shown in FIG. 7, the engaging pin 6 of the shield case 3 is protruded from the lower surface of the substrate 1 when it is inserted into the engaging recess 4 of the substrate 1, and the protruded portion 17b from the lower surface of the substrate 1 is bent so that the shield case 3 is securely fixed to the substrate 1 in the electronic component with the shield case according to Embodiment 3 of the present invention.

Since and the protruded portion 17b of the engaging pin 6 from the lower face side of the substrate 1 is bent in the electronic component with the shield case in Embodiment 3, the shield case 3 is securely fixed to the substrate 1 in the manufacturing step, making it possible to securely prevent positional shift of the shield case from occurring in the subsequent steps.

It is also possible in the electronic component with the shield case in Embodiment 3 to fix the engaging pin 6 to the engaging recess 4 of the substrate with a solder.

While the sheet substrate 11 is used and the sheet substrate 11 is cut into individual electronic component with the shield case after mounting the surface packaging substrate and attaching the shield case in the foregoing embodiments, the method for manufacturing the electronic component with the shield case is not particularly restricted, but a substrate that has been divided for each electronic component may be used without using the sheet substrate depending on circumstances.

While the present invention for manufacturing a high-frequency electronic component such as VCO to be used in a communication equipment has been described in the foregoing embodiments, the present invention can be also applied for manufacturing the other kinds of electronic components.

The present is not restricted to the embodiment as set forth above with respect to the other aspects, but various applications and modifications are possible with respect to the actual construction of the substrate and shield case, constituting materials, disposition and shape of the pin and engaging recess, and patterns of the land electrode and the like within the scope of the spirit of the present invention.

What is claimed is:

1. An electronic component with a shield case for housing surface mounted components on a substrate comprising:

a substrate provided with engaging recesses for attaching a shield case at plural sites on the side face of the substrate;

a surface mounted component mounted on the substrate; and a shield case having a main body covering the surface for mounting the surface mounted component of the substrate, and a plurality of engaging pins to be inserted into the engaging recesses of the substrate, the shield case being configured so that said main body is bent when predetermined engaging pins are engaged with the substrate by inserting the engaging pins into the corresponding engaging recesses of the substrate, wherein said bending causes the plural engaging pins on the shield case hold the substrate with enhanced elastic force.

2. An electronic component with a shield case according to claim 1, wherein a projection or a bending portion for engaging with the engaging recess of the substrate is provided on the engaging pin.

3. An electronic component with a shield case according to claim 1, wherein the engaging pins are protruded from the lower surface of the substrate, the shield case being fixed to the substrate by bending the protruding portions of the engaging pins from the lower surface of the substrate.

4. An electronic component with a shield case according to claim 1, wherein a step portion is provided on the inner circumference of the engaging recess of the substrate, said step portion is engaged with the engaging pin of the shield case.

5. An electronic component with a shield case according to claim 1, wherein a land electrode for electrical connection to the shield case is provided at the periphery of the engaging recess for mounting the surface mounted component on the substrate, the land electrode being connected to a part of the shield case with a solder.

6. An electronic component with a shield case according to claims 5, wherein a solder plating or a tin plating for improving solderability is applied on the portion of the shield case to be soldered to the land electrode.

7. An electronic component with a shield case for housing surface mounted components on a substrate comprising:

a substrate provided with opposed engaging recesses for attaching a shield case at plural sites on the side face of the substrate;

a surface mounted component mounted on the substrate; and a shield case having a main body covering the surface for mounting the surface mounted component of the substrate, and a plurality of opposed engaging pins to be inserted into corresponding opposed engaging recesses of the substrate, the distance between opposed engaging pins being smaller than the distance between corresponding opposed engaging recesses.

* * * * *